United States Patent [19]

Bonham, Jr.

[11] 4,445,633

[45] May 1, 1984

[54] AUTOMATIC BONDER FOR FORMING WIRE INTERCONNECTIONS OF AUTOMATICALLY CONTROLLED CONFIGURATION

[75] Inventor: Harry B. Bonham, Jr., Plano, Tex.

[73] Assignee: Rockwell International Corporation, El Segundo, Calif.

[21] Appl. No.: 348,108

[22] Filed: Feb. 11, 1982

[51] Int. Cl.³ ...................... B23K 31/02; H01L 21/90
[52] U.S. Cl. .................................. 228/102; 228/4.5; 228/7; 228/9; 228/103; 228/179
[58] Field of Search ................ 228/4.5, 8, 9, 10, 102, 228/103, 179, 7

[56] References Cited

U.S. PATENT DOCUMENTS

| | | | |
|---|---|---|---|
| 3,819,102 | 6/1974 | Isobe | 228/4.5 X |
| 4,068,371 | 1/1978 | Miller | 228/4.5 X |
| 4,109,846 | 8/1978 | Pennings et al. | 228/4.5 |
| 4,266,710 | 5/1981 | Bilane et al. | 228/8 X |
| 4,327,860 | 5/1982 | Kirshenboin et al. | 228/4.5 X |

*Primary Examiner*—Kenneth J. Ramsey
*Attorney, Agent, or Firm*—Richard A. Bachand; V. Lawrence Sewell; H. Frederick Hamann

[57] ABSTRACT

An automatic wire bonder for bonding at least one wire between a first predetermined location on a workpiece and a second predetermined location on a substrate on which the workpiece is carried includes a wire feeding head, and means for moving the head, in x, y, and z directions, relative to the workpiece, x and y being at least parallel to the plane of the workpiece and z being an elevation direction above the workpiece. Means are included for determining a z direction measurement between the first and second predetermined locations. The bonder is computer controlled to automatically dispense the wire and to configure it to a predetermined configuration to include a partially circular portion and an adjacent straight portion to be bonded between the first and second predetermined locations. The shape of the partially circular portion and the length of the straight portion are automatically determined by at least the z direction measurement.

11 Claims, 5 Drawing Figures

AUTOMATIC BONDER FOR FORMING WIRE INTERCONNECTIONS OF AUTOMATICALLY CONTROLLED CONFIGURATION

BACKGROUND OF THE INVENTION

1. Field of the Invention

This invention relates to improvements in automatic wire bonders, and more particularly to improvements in wire bonders of the type in which a plurality of wires are connected between a first set of predetermined points of possible varying elevations to a second set of predetermined points on an underlying substrate.

2. Description of the Prior Art

In the field of wire bonders, for application, for example, in attaching non-insulated, conducting leads, or wires, between an integrated circuit chip, or component such as a transistor, resistor, capacitor or the like, to an underlying substrate, several considerations are of concern.

One consideration of acute interest is that often times the elevation above the substrate to which connection is to be made is not constant. For example, in making wire connections between an integrated circuit chip on which connection pads are provided onto an underlying substrate, the levelness or flatness of the chip on the substrate may vary due to variations in chip mounting techniques or height differences upon the chip itself. The resulting height variations may be from pad to pad on the same chip, or the height variations may be elevation variations from chip to chip on the same substrate or even on a different substrate.

Ideally, it is desired that the wire connection achieved be made by a wire of such configuration, or dress, that it does not extend so high above the substrate to which connection is made as to short against a cover or package into which the circuit is intended to be mounted. On the other hand, if the wire is made too short, it may short against the edge of the chip, also causing undesirable consequences.

It has been found that a particularly suitable shape for the wire is in the form of a portion of a circle immediately adjacent the chip and a straight line portion extending from the circular portion to the substrate onto which the connection is to be made. The connection to the circuit is usually by a "ball" bond, and the connection to the underlying substrate is usually by a "wedge" bond, such ball and wedge bonds being well known in the art.

It has been found that a desired wire dress can be approximately achieved manually by feeding the wire from a spool through a capillary tube and manually tracing a pattern by the capillary tube to force the wire to the desired dress pattern. The manual performance of this procedure is difficult to learn by machine operators, as it must be done by "cut and try" methods, and is not conducive to repeated accurate wire bonding.

More specifically, the manual method previously developed by applicant is to attach the wire to the chip by a ball bond, then feed out an additional portion of wire from the capillary tube. The capillary tube is then moved in a direction away from the direction the wire is to ultimately run, and a downward pressure is applied to the wire, causing it to bend to assume an arcuate or circular shape. An additional length, sufficient to reach the connection point of underlying substrate is fed out (approximately) through the capillary tube, and the tube is moved to the connection point and the wedge bond is made. The capillary tube is then raised, allowing a small measured portion of wire to be pulled from the capillary. When the desired amount of wire is pulled from the capillary, the wire is clamped so that no more wire will leave the capillary. An additional vertical pressure is applied to the capillary, causing the wire to break at the wedge bond, resulting in a pig-tail extending from the capillary tube. A high voltage lead is then moved into contact with the pig-tail, melting it into the form of a ball. The ball is then brought into position at a new location on the component substrate, and the process is repeated.

In the past, in the field of automatic wire bonders, the capillary was first moved downwardly until the ball was brought into contact with the pad to which connection is intended to be made. After the bond has been made, the capillary was moved directly up and then to a location above where the wedge bond was to be made. Finally the capillary was lowered to make the wedge bond. The wire naturally bent at a location along its length immediately next to the first made ball bond because of the moment exerted onto it by the capillary movement and because this area is weakest due to the heat applied during the formation of the ball.

The resultant wire configuration, or dress, was usually a fairly straight line with a slight curvature immediately adjacent the ball bond. This configuration resulted in several problems, including, often times, the shorting of the wire against the chip on which it was made. Another problem encountered, especially where a fairly long length of wire is necessary for connection, is that the wire sometimes sags or deforms, shorting against other wires or other parts of the substrate on which the wedge bond is to be made. Another problem encountered by prior art automatic bonders is that the wire is sometimes streched or deformed, sometimes even broken, when it is moved to the location for connection. These problems become especially acute if the chip from which connection was to be made has not been mounted with precision. That is if, for example, an integrated circuit chip were to be mounted at an angle from that position for which the bonder was programmed, some of the wires would be too long and some too short.

Because of the inability of prior automatic bonders to achieve a consistent, well formed wire dress, the use of automatic bonders has been limited to use in less dense configurations in which the wire dress is not critical. In some prior art applications, in efforts to minimize the effects of these problems, especially the sagging of wires, the entire substrate has been coated with an insulating material, except at the points at which connections are desired. This results in additional expense and extra steps in the manufacturing process. In the more dense connection applications, those configurations have been necessarily fabricated manually, but, because of the large number of connections and the difficulty of achieving consistent wire dress, even manually, yields ordinarily achieved have not been particularly high.

In the past, when an unacceptable bond has been made to a chip manual efforts were required to correct the bond, such as attempting to raise a sagging connection. However, one solution which was not available was to bond a new wire in its place, since manufacturers frequently refuse to accept circuits containing ball bond to ball bond connections. Thus, if an unacceptable, uncorrectable connection is made, the entire chip must be chiseled from the substrate and a new one mounted in its place. Then all of the connections must be reestablished. Presently, many chips used in hybrid circuits of the type described herein are quite expensive; consequently, an additional pressure is found to ensure that the wire connections are properly achieved the first time.

BRIEF DESCRIPTION OF THE INVENTION

In light of the above, it is, therefore, an object of the invention to provide an automatic wire bonder which generates a consistent wire dress of predetermined length and shape.

It is another object of the invention to provide an automatic bonder of the type described which compensates for height and length variations of the points between which wire connections are made.

It is still another object of the invention to provide an automatic bonder of the type described which can be used to make wire connections of higher density than heretofore automatically achievable.

It is still another object of the invention to present a method for automatically establishing wire interconnections between first and second predetermined points, each wire being configured in accordance with the height difference between the first and second predetermined points.

It is another object of the invention to provide an apparatus for providing interconnections of consistent inductance and resistance for more repeatable circuit performance.

It is yet another object of the invention to provide an apparatus for trimming r-f circuits by addition of controllable wire interconnections of controllable inductances.

These and other objects, features and advantages will become apparent to those skilled in the art from the following detailed description, when read in conjunction with the accompanying drawing and appended claims.

In accordance with a broad aspect of the invention, an automatic wire bonder for bonding at least one wire between a first predetermined location on a workpiece and a second predetermined location on a substrate on which the workpiece is carried is presented. The bonder includes a wire feeding head, and means for moving the head, in x, y, and z directions, relative to the workpiece, x and y being within the plane of the workpiece and z being an elevation direction above the workpiece. Means are included for determining a z direction measurement between the first and second predetermined locations, as well as means using at least the z-direction measurement for producing a desired wire configuration. Additionally, means are included for bonding the wire configuration between the first and second predetermined locations.

In accordance with another broad aspect of the invention, a method is disclosed for making wire interconnections between first and second predetermined points on a workpiece and a substrate for mounting under a cover. The method includes the steps of providing an automatic bonding machine having a bonding head movable in x, y, and z directions, x and y being within a plane parallel to the workpiece and z being an elevation direction above the workpiece, controlled by a computer to move between the predetermined first and second points to bond lengths of wires between preselected ones of the predetermined first and second points. A wire length is sequentially bonded between the preselected first and second points by operating the computer to: (1) measure a height difference between each of the predetermined first and second points, (2) control the path of the bonding head in accordance with an alogrithm using at least the measured height difference to form each of the wire lengths into an arcuate portion adjacent the workpiece and a straight portion tangentially extending from the arcuate portion to the substrate to have a dress to clear the workpiece and the cover.

BRIEF DESCRIPTION OF THE DRAWING

The invention is illustrated in the accompanying drawing in which.

In the various figures of the drawing, like reference numerals are used to denote like parts. In addition, various sizes and dimensions of the parts have been exaggerated or distorted for ease of description and clarity of illustration.

DETAILED DESCRIPTION OF THE PREFERRED EMBODIMENTS

The invention is intended to be practiced in conjunction with automatic bonders which are commercially available. For example, one bonder which is particularly well suited for use in practicing the invention is that made by Hughes Aircraft Company, model no: HMC 2460 with electronic flame-off, although other bonders with equivalent functions can be equally advantageously employed.

One requirement of the particular bonder chosen for use in making wire interconnections in practicing the invention is that the bonder be capable of being controllably moveable above the workpiece, and, ideally, be capable of producing a vertical registration signal, to enable the wire dress to be controlled, as will become apparent below.

Figure 1:
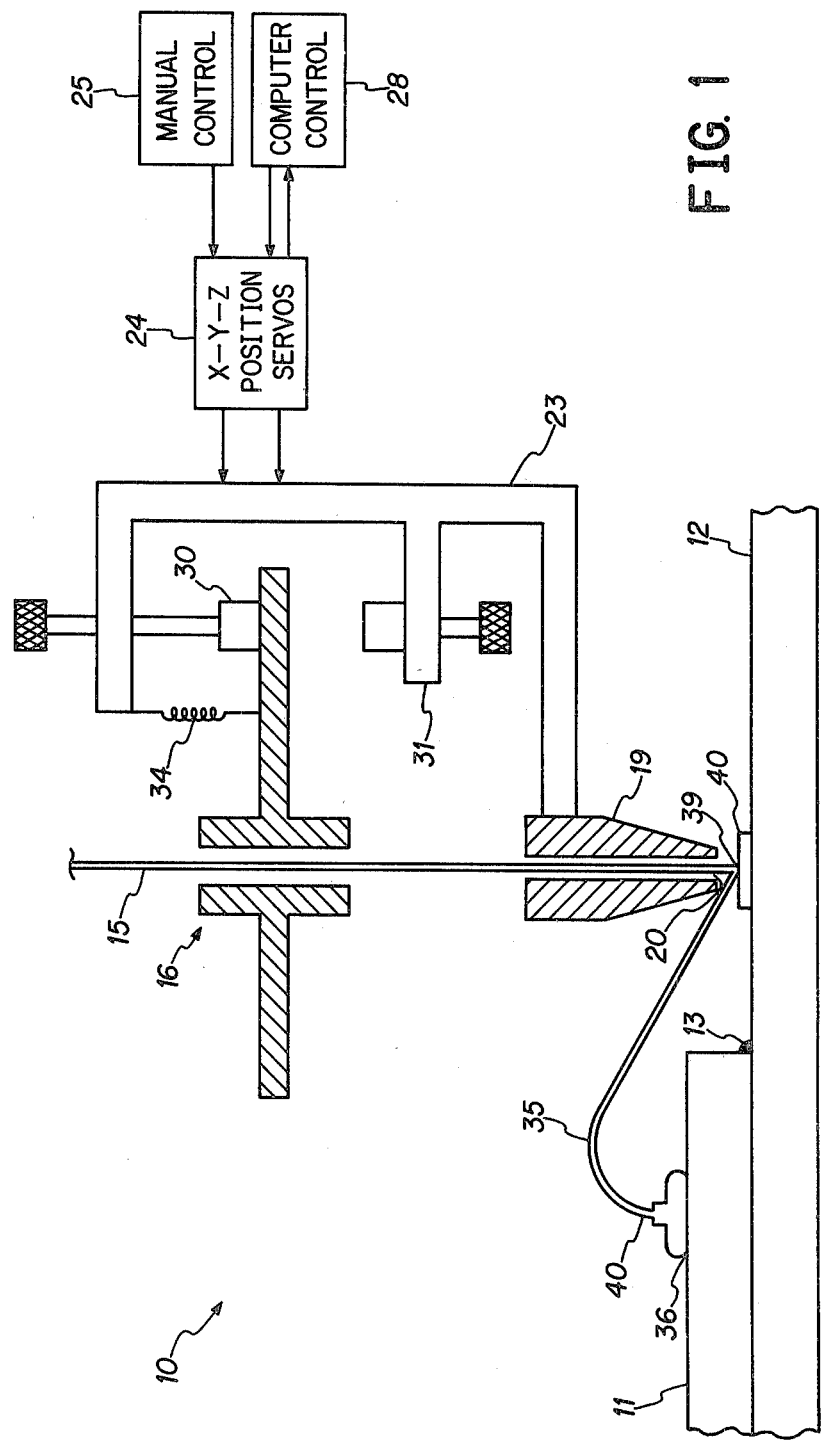
FIG. 1 is a side elevational view of bonding apparatus for use in practicing the invention.

A head portion of a bonder for use in practicing the invention is shown diagrammatically in FIG. 1, and is denoted generally by the reference numeral 10. The bonder is intended to form a plurality of wire interconnections between a first set of locations on a component, such as an integrated circuit 11, as shown, and a second set of locations on a substrate 12 onto which the integrated circuit is mounted by glue or cement 13 or other means.

Wire 15 from a spool or other source (not shown) is routed through a wire clamp assembly 16 through a capillary tube 19 to be dispensed through an opening 20 in the capillary tube 19. The capillary tube is carried upon a frame 23 which is positionable in three dimensions, x, y, and z, by position servos 24. The position servos 24 are controlled either manually by a manual control 25 or by a computer control 28. It should be noted that the dimensions x, y, and z are merely used for reference, and do not necessarily imply an orthogonal reference system; and, if fact, can vary among each different component to which wires are connected, as explained below.

In the embodiment represented in FIG. 1, the frame 23 includes adjustable top and bottom stops 30 and 31 against which the clamp assembly 16 bears in the upward and downward travel of the bonder head assembly 10. This is to enable the formation of a pig-tail on the wire extending from the opening 20 of the capillary 19 after the formation of a wedge bond from which a ball can be formed for subsequent wire formations. The clamp assembly is normally biased against the upper adjustablet stop 30 by a spring 34, or the like. (It should be noted that in computer operated machines of the type described in which the height can be automatically controlled, the stops 30 and 31 may be unnecessary, as the closure of the clamp assembly 10 can be controlled by the computer by appropriate programming (not shown).)

Thus, the bonder is intended to route a wire connection 35 between a point 36 on the integrated circuit 11 and a point 39 on a conductive lead 40 on the substrate 12. In conventional fashion, the connection at the point 36 is a ball bond, and the connection at the point 39 is a wedge bond.

Briefly, the bonder operates to first connect the wire 35, on which a ball has been previously formed, to the point 36, and the capillary 19 raised, with the clamp assembly open. The raising of the capillary 19 serves to dispense a quantity of bulk wire 15 for connection to the location 39. (In the prior art, the capillary was moved directly to the second location 39, causing the wire member 35 to bend about the location 40 just above the ball bond to form a configuration, not shown, in which the wire 35 extends practically along a straight line from the ball bond to the location 39.) After the wedge bond has been established at the location 39, the capillary 19 is again raised, but with the clamp assembly 16 closed. This upward motion causes the clamp assembly to come into contact with the bottom adjustable stop 31, after a quantity of bulk wire has been dispensed from the opening 20 of the capillary corresponding to the distance between the upper and lower adjustable stops 30 and 31. When the capillary is moved upward still further, the wire breaks at its weakest point, immediately adjacent the wedge bond, leaving a pig-tail extending from the opening 20 of the capillary 19.

A high voltage lead (not shown) is brought into proximity with the pig-tail to produce an electrical current through the pig-tail, melting the wire to form a ball for the next wire interconnection.

Figure 2:
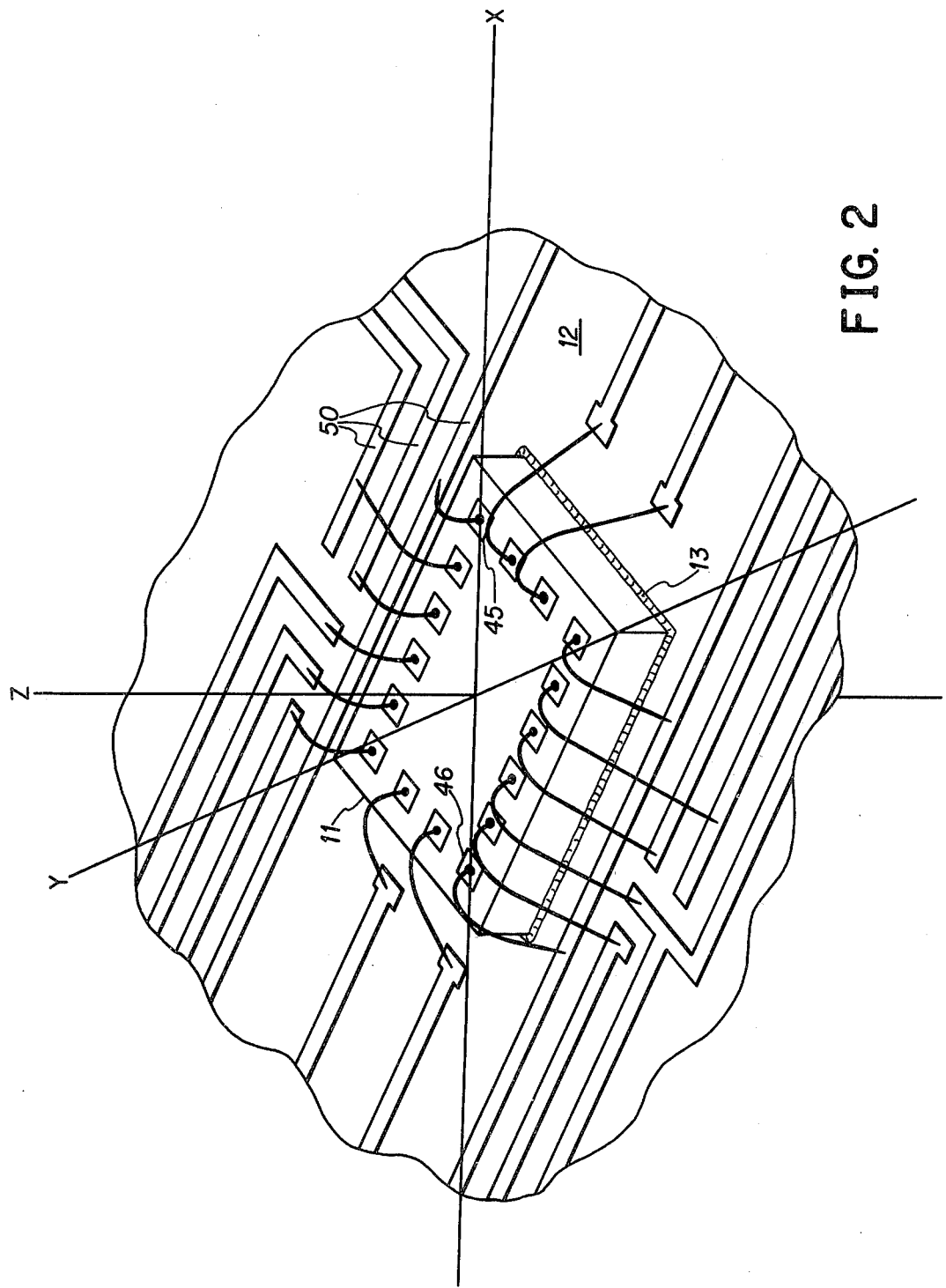
FIG. 2 is a perspective view of an integrated circuit package emplaced on a supporting substrate and with wires interconnecting the circuit to conductive locations of the substrate, in accordance with the invention.

In accordance with the invention, a plurality of wire interconnections are made from a plurality of first points on a component to a corresponding plurality of second points on a substrate, as illustrated in FIG. 2. In FIG. 2, the integrated circuit chip 11 is mounted onto the substrate 12 by an adhesive 13 in a predetermined location. Ordinarily, the integrated circuit chip 11 is mounted manually, so some tolerances must be handelable in the locating the points from which connections are to be made. One way in which this is done is by manually referencing the capillary over connection pads at two opposite corners 45 and 46 of the chip 11. (The corresponding locations of the points to which wire connections are to be made have previously been inputted to the positioning computer 28.) The computer, with the manual referencing information then generates a custom x-y coordinate system for the particular chip being processed. A third coordinate, labelled z, extends upwardly from the chip surface, and although it is shown as being perpendicular to the surface, it is not necessary that it be so, and, in fact, in many instances, it may be desirably aligned along a non-perpendicular direction.

As shown in FIG. 2, a plurality of wire connections are made from the locations on the integrated circuit chip 11 to corresponding locations on conductors 50 on the substrate 12. As mentioned, it is desireable that the dress of the wires 35 be such that they do not come into contact with the edge of the chip 11 (especially in cases where the chip material is active, as silicon, in integrated circuit applications). Additionally, it is desired that the upward extension of the wires not be such that the wires come into contact with a cover or lid (not shown) into which the final assembly may be mounted. Thus, the allowable height under the cover or lid must be taken into consideration in conjunction with the height of the integrated circuit package as well as the height differences due to variations in the adhesion process and in the lateral distance between the points of connection.

One particular wire dress configuration formed in accordance with the invention is shown diagrammatically in FIG. 3, and the configuration considerations are described in detail below.

The idealized wire loop is described in terms of the component height, C, and wire span, W. A series of bonder movements are determined which depend only on W and C to result in the configuration shown. The wire loop has two segments. The first segment 55 is a portion of a circle. The second segment 56 is a straight line.

The first segment 55, of length, l, is defined as follows:

$$l = \pi \alpha r / 90 \qquad \text{EQ(I)}$$

$$Q = 2R \sin \alpha \qquad \text{EQ(II)}$$

The circle must be of sufficient radius R so that it clears the edge of the component, but not so large as to short to the package lid. The second segment 56 is a straight line of length U which connects the point (a,b) to the wedge bond located at point 39 having coordinates (W,0). Thus:

$$U = \sqrt{(W-a)^2 + b^2}$$

Figure 3:
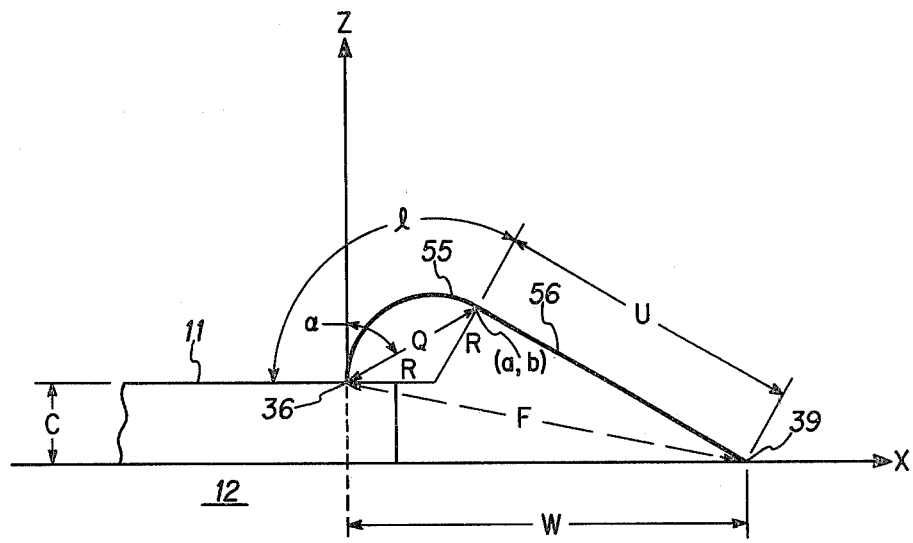
FIG. 3 is a side elevational view of a substrate and circuit element, showing the dimensions of a wire connected therebetween, in accordance with the invention.

Since the wire exits perpendicularly to the ball bond, it can be seen from FIG. 3 that:

$$a = Q \sin \alpha \qquad \text{EQ(III)}$$

$$b = Q \cos \alpha + C \qquad \text{EQ(IV)}$$

The two segments, arc and straight line, must be continuous and their derivatives must be continuous at the point (a,b). For the arc segment $x \leq a$, the loop is defined by the circle:

$$(y-c)^2 = x(2R-x), \; x \leq a$$

For the straight segment $x \geq a$, the loop is defined by the line:

$$y = (b/(w-ax))(w-x), x \geq a$$

Matching the equations and their derivatives at $x = a$, reduces to the requirement that:

$$a = R(S^2 + WR) \pm RSC/(S^2 + R^2)$$

where $S = \sqrt{Z^2 - 2WR}$ and $Z^2 = W^2 + C^2$

Since when $W = 2R$, $a = w$, the positive sign in the above equation must be chosen:

$$a = (R(S^2 + WR) + RSC)/(S^2 + R^2) \qquad \text{EQ(V)}$$

$$\text{Thus } \alpha = \arcsin \sqrt{a/2R} \qquad \text{EQ(VI)}$$

In the above, R, the radius of the arc portion of the loop must be defined in terms of only component height and wire span. The definition of R is directly related to Mil Std. 883B requirements for internal visual inspection. The arc radius determines loop height and wire to edge of component clearance. Thus, R should decrease as component height increases to prevent wire to package lid shorts. But, R must not become so small as to allow electrical shorts between the wire and the edge of the component. One choice for R is as follows:

$$R = M + (N - KC)W$$

where M, N, and K are constants. By inspection, it can be seen that this equation meets the general requirements stated above. One needs only to pick the appropriate values for the constant to scale R into the range of interest.

Loop height for a given wire is the sum of arc radius plus component height:

$$LH = R + C$$
$$= M + NW + C(1 - KW)$$

Loop height is therefore maximum when $K = 1/W$ and $N = KC = C/W$

Thus, $LH(MAX) = M + C$.

As mentioned, the maximum loop height includes factors for the lid clearance, the package depth the substrate thickness and the component height. An appropriate loop height may be, for instance, 85 mils. If a typical component height is, for example 80 mils, then $M = 85 - 80 = 5$ mils.

When bonding substrate jumpers of minimum bond span, the arc radius should equal one-half the wire span.

$W(MIN) = 20$ mils $C = 0$ for jumpers $10 = 5 + (N - K)20$ $N = 0.25$

When component height is maximum, loop height should be independent of wire span. If loop height increased with wire span, wire to package lid shorts would occur. If loop height decreases with wire span, then wire to component shorts would occur.

Thus, $N = KC$ for C (Maximum)

OR, $K = 1/320$

Therefore, R, arc radius is defined by:

$$R = (1600 + (80 - C)W)/320 \qquad \text{EQ(VIIa)}$$

In some cases, small wire spans, the arc radius as defined may be larger than one half the wire span. This would result in a loop which lays to one side. Therefore, an additional requirement is placed upon R.

If $2R > W$, let $R = W/2$ \qquad EQ(VIIb)

The constants M, N, and K above have been defined as 5, 0.25, and 0.003125 respectively. These constants should be programmed so that they apply to every wire bonded.

Figure 4:
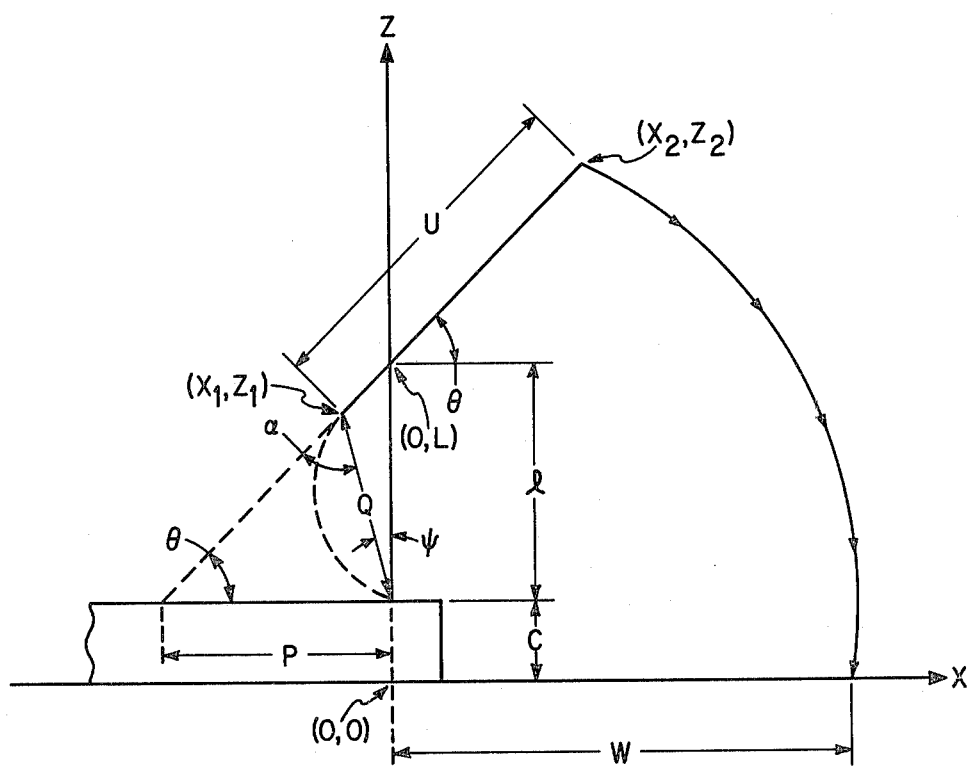
FIG. 4 is a diagrammatic illustration of the formation of the wire dress by an automatic bonder in accordance the invention.

The machine movements needed to achieve the particular wire dress will presently be discussed, with reference to FIG. 4.

After completing the ball bond, the head moves straight up to point $(0,L)$. This plays out the wire length needed to form the arc portion of the loop. At this point, the wire clamp assembly 16 closes to prevent additional wire feed, and the capillary, relative to the origin $(0,0)$, moves along a straight line to the point $(X_1, Z_1)$. This movement forces the wire to bend into the required arc. Wire clamp assembly 16 then opens and the capillary moves in a straight line to position $(X_2, Z_2)$. During this movement, very little tension or drag may be applied to the wire since the previously formed arc must not be distorted. The movement to $(X_2, Z_2)$ plays out the wire length, U, required to complete the interconnection. At this point, the wire clamp assembly 16 again closes to prevent additional wire feed and the capillary 19 moves along a circle path to the wedge bond location. During the wedge bond formation, the clamp assembly 16 opens so a wire tail may be formed for the next flame off, as above described. The circle path referenced above may be approximated by several points on the circle, if necessary. Definition of the points $(0,L)$, $(X_1, Z_1)$, $(X_2, Z_2)$, and the radius of the circle R in terms of component height and wire span completes the looping algorithm.

The point $(0,L)$ defines the length of wire in the arc portion of the loop.

$$L = l + C$$
$$= (\pi \alpha R/90) + C$$

To compensate for slippage in the system, a constant should be added. The value of the constant, A, can be determined empirically. (Without slippage, its value is 0.)

$$L = (\pi a R/90) + C + A \quad \text{EQ(VIIIa)}$$

$$-10 \leq A \leq +10 \quad \text{EQ(VIIIb)}$$

By inspection of FIG. 4, it can be seen that $X_1$ is defined as follows:

$X_1 = -Q\sin \psi$
and $\psi = \theta + \alpha - 90$
Therefore, $X_1 = Q\cos(\theta + \alpha)$  EQ(IXa)

Also, the point $(X_1, Z_1)$ must be on a circle of radius Q and center at the point $(0, C)$. This requires $$(Z_1 - C)^2 = Q^2 - X_1^2$$

$$\text{or } Z_1 = \sqrt{Q^2 - X_1^2} + C \quad \text{EQ(IXb)}$$

(Recall Q and $\alpha$ are defined by equations II and IV—the angle $\theta$ is defined below.) From FIG. 4 it can be seen that:

$X_2 = U\cos \theta + X$  EQ(Xa)
or
$X_2 = (Ua/l) + X_1$, since $X_1 < 0$, and the loop definition as set forth above is $$U = \sqrt{(W - a)^2 + b^2}$$

Since the equipment may have slippage a constant B should be added. Like the constant A, if no slippage occurs then B=0. B also may be determined empirically.

$$U = \sqrt{(W - a)^2 + b^2} + B \quad \text{EQ(Xb)}$$

$$-10 \leq B \leq 10 \quad \text{EQ(Xc)}$$

Like the point $(X_1, Z_1)$, the point $(X_2, Z_2)$ must be on a circle. This circle has the radius F, straight line distance ball bond to wedge bond, and its center is the ball bond point $(0, C)$. Therefore, $$(Z_2 - C)^2 = F^2 - X_2^2$$

or $$Z_2 = \sqrt{F^2 - X_2^2} + C \quad \text{EQ(Xd)}$$

The angle of rotation, $\theta$, may be determined using the law of sines.

$P/\sin \alpha = Q/\sin \theta$
and $P = l/\tan \theta$
Thus, $\cos \theta = Q/l \sin \alpha$
or $\cos \theta = a/l$
Thus, $\theta = \arccos(a/l)$  EQ(XI)

the values of a and l are given by equations V and I.

The circle path followed in moving from point $(X_2, Z_2)$ to the wedge bond is by inspection of FIG. 3, a circle of radius F whose center is the ball bond position $(0, C)$. Thus, the equation of the arc is $$(Y - C)^2 = F^2 - X^2 \quad \text{EQ(XII)}$$

Where F is the straight line distance ball bond to wedge bond or $$Z = \sqrt{C^2 + W^2}$$

Figure 5:
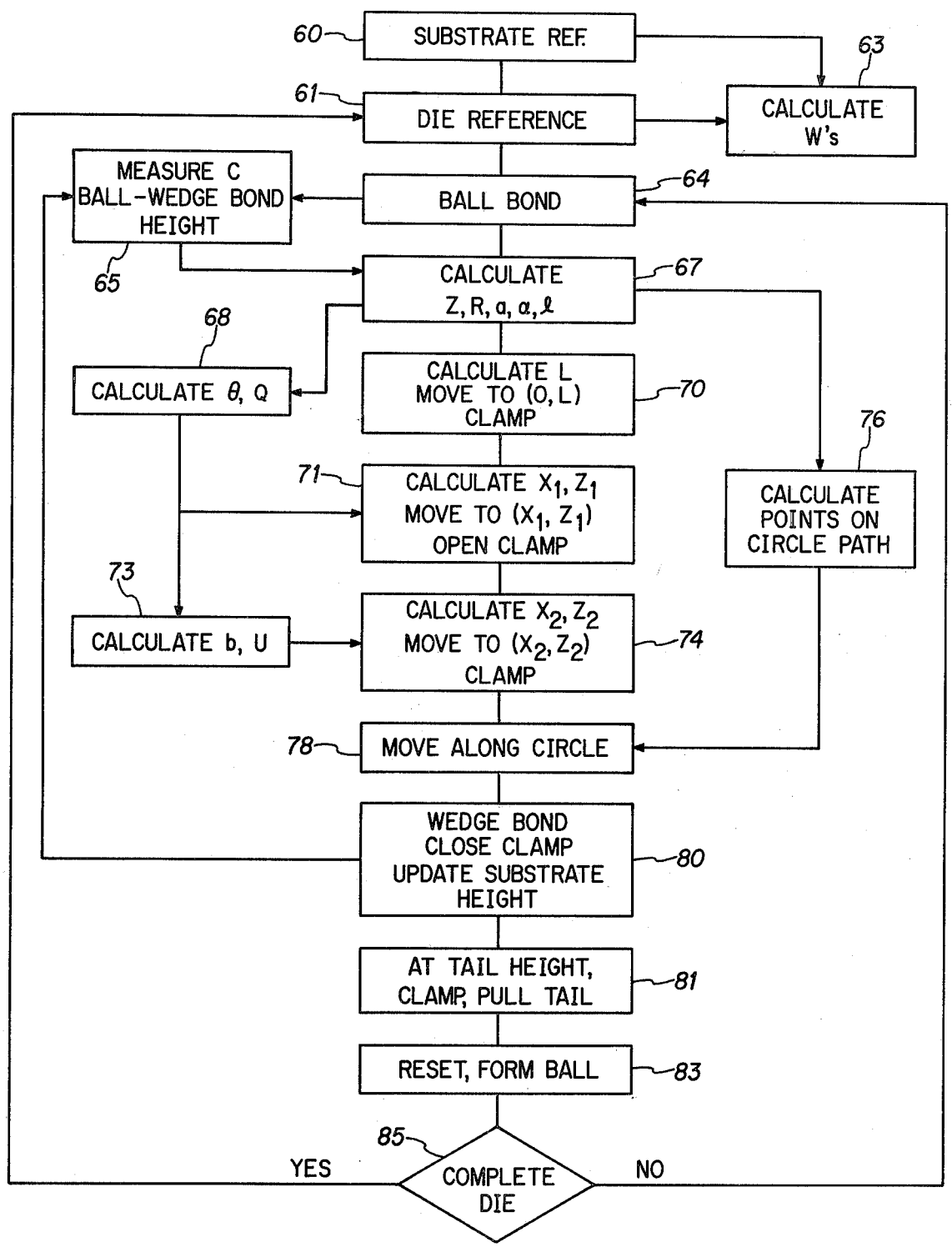
FIG. 5 is a flow chart showing the steps used in practicing the invention.

With reference now to FIG. 5, the operation of the bonding machine and process it executes in forming a plurality of wire interconnections is shown, in flow chart form. Thus, first, the substrate upon which the integrated circuit chip or component is carried is referenced, box 60. The die is then manually referenced, box 61, and, from the substrate and die reference information, the wire span length (W) is calculated, box 63.

Then, the first ball bond is made, box 64. As the ball bond is being accomplished, the height, C, is automatically measured, box 65. (The height of the substrate, or location of the wedge bonds is known, and has been previously referenced) into the computer.

With this information, the variables F, R, a, $\alpha$, and l are calculated, box 67. With these variables defined, variables Q and $\theta$ are calculated, box 68. Also, variable L is calculated, and the capillary is moved to $(0, L)$, and the clamp assembly 16 is closed, box 70. Then, with information $\theta$, Q, and L, $(X_1, Z_1)$ is calculated, the capillary is moved to that point, and the clamp assembly 16 is opened, box 71.

Concurrently, from the variables $\theta$ and Q, variables b and U are calculated, box 73. With the information generated to this point, $(X_2, Z_2)$ is calculated, the capillary is moved to point $(X_2, Z_2)$, and the clamp assembly 16 is again opened, box 74. Also, concurrently, the points on the desired circular capillary path are calculated, box 76, and thereafter, the capillary is moved along the circular path to the location at which the wedge bond is to be made, box 78.

The wedge bond is then made, the clamp assembly 16 is closed, and the capillary raised to form a pig-tail at the opening 20 of the capillary 19, box 80. If desired, the height of the wedge bond can be measured and updated for subsequent bonding operations, as shown in box 80, with the information being directed to box 65.

After the formation of the wedge bond, at the height of the capillary above the workpiece, the clamp assembly remains closed, to form the pig-tail at the opening 20 of the capillary 19, box 81, and the ball is formed for the next subsequent bond, box 83. A decision is then made, block 85, to determine if the entire die has been completed. If so, the capillary is moved to the next die to be manually referenced, box 61, as above described. If not, then the process is repeated from the ball bond formation step, box 64.

Another feature of the apparatus and method of the invention is that because the wire bonds can be repeated consistently, the inductance and resistance of the interconnecting wires can be controlled to a greater degree than heretofore possible. This results in smaller variations in performance from circuit to circuit manufactured. In addition, because of the great degree of controllability of the method and the wire configurations achieved, the apparatus can be used handily to tune r-f stripline circuits by the addition of carefully controlled lengths of wire of known inductance and resistance. Although the invention has been described and illustrated with a certain degree of particularity, it is understood that the present disclosure has been made by way of example only and that numerous changes in the combination or arrangement of parts may be resorted to by those skilled in the art without departing from the spirit and scope of the invention as hereinafter claimed.

I claim:

1. An automatic bonder for bonding at least one wire between a first location on a workpiece and a second location on a substrate on which the workpiece is carried, comprising:
   a wire feeding head,
   means for determining a height measurement between the first and second locations,
   means for using at least the height measurement for producing a desired wire configuration after the wire has been bonded to the first location and prior to when the wire is bonded to the second location, including:
   a computer programmed to move said wire feeding head along a predetermined path relative to the workpiece to form the wire,
   said path being from the first location:
   upwardly to dispense a sufficient amount of wire to form an arcuate shaped portion,
   away from the second location,
   downwardly to bend the dispensed wire into an arcuate configuration,
   upwardly to dispense a sufficient amount of wire to form a straight line configuration to reach the second location,
   and circularly to bring said head to the second location,
   and means for bonding the wire at the first and second locations.

2. An automatic bonder for bonding at least one wire between a first predetermined location on a workpiece and a second predetermined location on a substrate on which the workpiece is carried, comprising:
   a wire feeding head including a wire dispensing capillary,
   means for moving said head in x, y, and z directions relative to the workpiece, x and y being at least parallel to the plane of the workpiece and z being an elevation direction above the workpiece,
   means for determining a z direction measurement between the first and second predetermined locations,
   means using at least the z direction measurement for producing a desired wire configuration including an arcuate portion adjacent said first predetermined location and a straight portion tangentially joining the arcuate portion and extending to the second predetermined location, formed by said wire feeding head following a predetermined path to bend the wire as said head traverses the path,
   said path being, from the first predetermined location:
   upwardly in the z direction to dispense an amount of wire to form the arcuate shaped portion,
   away from the second predetermined location,
   downwardly in the z direction to bend the wire dispensed during the upward movement into the arcuate configuration,
   upwardly in the z direction to dispense an amount of wire to form a straight line configuration,
   and arcuately to bring the head to the second predetermined location,
   and means for bonding the wire configuration between the first and second predetermined locations.

3. A method for making wire interconnections between first and second predetermined points on a workpiece and a substrate for mounting under a cover, comprising:
   providing an automatic bonding machine having a bonding head movable in x, y, and z directions, x and y being substantially parallel to a plane of the workpiece and z being an elevation direction above the workpiece, controlled by a programmed computer to move sequentially between the predetermined first and second points to bond lengths of wires between the predetermined first and second points;
   bonding a wire length between each of the preselected first and second points by operating the computer to:
   (1) measure a z direction difference between the predetermined first and second points; and
   (2) control the path of the bonding head in accordance with an algorithm using at least the measured z direction difference to form the wire length into an arcuate portion adjacent the workpiece and a straight portion tangentially extending from the arcuate portion to the substrate to have a dress to clear the workpiece and the cover, the path of the head being:
   (a) upwardly in the z direction from the first predetermined point;
   (b) away from the second predetermined point;
   (c) downwardly in the z direction to form the wire into an arcuate shape;
   (d) upwardly in the z direction to a distance corresponding to the length of the straight portion of the wire to be interconnected between the predetermined first and second points; and
   (e) arcuately along a path to bring the head to the second predetermined point.

4. The bonder of claim 1 wherein said wire feeding head includes a wire dispensing capillary.

5. The bonder of claim 1 wherein said means for using at least said height measurement forms the desired wire configuration additionally using a lateral distance between the first and second locations.

6. The bonder of claim 1 wherein the desired wire configuration includes a portion of a circle adjacent the first location and a straight portion tangentially joining the portion of a circle and extending to the second location.

7. The bonder of claim 2 wherein said means for using at least the z direction measurement forms the desired wire configuration additionally using a lateral distance between the first and second predetermined locations.

8. The method of claim 3 wherein the arcuate shape is circular.

9. The method of claim 3 further comprising the steps of dispensing wire from said head during the upward and away movements of said steps (a) and (b).

10. The method of claim 3 further comprising the steps of forming a ball bond at the predetermined points on the workpiece and forming a wedge bond at the predetermined points on the substrate.

11. An automatic wire bonder having means for receiving a wire supply from which wires interconnecting respective first and second sets of locations are formed, comprising:
   a wire dispensing capillary, means for automatically moving the capillary in three dimensions in a sequence among the first and second sets of locations to form wire interconnections between preselected ones of said locations, means for measuring the height of said capillary as it is moved to each of said first set of locations, means for establishing a ball bond of the wire to said one of said first set of locations, a programmed computer circuit to control the movement of said capillary at least after said ball bond is established to:
 (1) move upwardly to dispense a sufficient amount of wire which when formed into an arcuate shape will clear the substrate of the first location,
 (2) move at least laterally in a direction opposite the direction of the location of the location of the second set to which connection is to be made,
 (3) move downwardly an amount sufficient to bend the dispensed wire into the arcuate shape, determined by the measured height,
 (4) move upwardly along a straight line an amount to dispense an amount of wire to reach the second location when the wire is in position,
 (5) move along an arcuate path to the second location to bend the dispensed wire adjacent the ball bond and to emplace the wire between the first and second locations, means for forming a wedge bond at said second location.

* * * * *